United States Patent
Kim et al.

(10) Patent No.: US 9,166,123 B2
(45) Date of Patent: Oct. 20, 2015

(54) LIGHT EMITTING DEVICE PACKAGE AND METHOD FOR MANUFACTURING THE SAME

(75) Inventors: Geun ho Kim, Seoul (KR); Yu Ho Won, Seoul (KR); Chil Keun Park, Seoul (KR); Ki Chang Song, Seoul (KR)

(73) Assignees: LG ELECTRONICS INC., Seoul (KR); LG INNOTEK CO., LTD., Seoul (KR)

( * ) Notice: Subject to any disclaimer, the term of this patent is extended or adjusted under 35 U.S.C. 154(b) by 23 days.

(21) Appl. No.: 12/755,822

(22) Filed: Apr. 7, 2010

(65) Prior Publication Data

US 2010/0187556 A1 Jul. 29, 2010

Related U.S. Application Data

(63) Continuation of application No. 11/890,543, filed on Aug. 7, 2007.

(30) Foreign Application Priority Data

Aug. 8, 2006 (KR) .......................... 10-2006-0074751
Aug. 21, 2006 (KR) .......................... 10-2006-0078635
Dec. 19, 2006 (KR) .......................... 10-2006-0130114

(51) Int. Cl.
*H01L 33/00* (2010.01)
*H01L 33/50* (2010.01)
*H01L 33/48* (2010.01)
*H01L 23/00* (2006.01)

(52) U.S. Cl.
CPC .............. *H01L 33/505* (2013.01); *H01L 24/97* (2013.01); *H01L 33/486* (2013.01); *H01L 2224/16225* (2013.01); *H01L 2224/32245* (2013.01); *H01L 2224/48091* (2013.01); *H01L 2224/48137* (2013.01); *H01L 2224/48247* (2013.01); *H01L 2224/73265* (2013.01); *H01L 2224/97* (2013.01); *H01L 2924/12041* (2013.01)

(58) Field of Classification Search
CPC ..... H01L 21/563; H01L 23/13; H01L 33/502; H01L 33/486; H01L 33/505; H01L 2224/32245; H01L 2224/48091; H01L 2224/48247; H01L 2224/73265; H01L 2224/48137; H01L 2224/16225; H01L 2224/97; H01L 24/97; H01L 2924/12041
USPC ...................... 257/98, 99, 100, 676, E33.057
See application file for complete search history.

(56) References Cited

U.S. PATENT DOCUMENTS 5,177,593 A    1/1993  Abe
6,614,057 B2   9/2003  Silvernail et al.
(Continued)

FOREIGN PATENT DOCUMENTS

EP    0 890 996    1/1999
EP    1 179 858    2/2002
(Continued)

*Primary Examiner* — Vongsavanh Sengdara
(74) *Attorney, Agent, or Firm* — Dentons US LLP

(57) ABSTRACT

A light emitting device package capable of emitting uniform white light and a method for manufacturing the same are disclosed. The light emitting device package includes a package body, an electrode formed on at least one surface of the package body, a light emitting device mounted on the package body, and a phosphor layer enclosing the light emitting device while having a uniform thickness around the light emitting device.

23 Claims, 21 Drawing Sheets

(56) References Cited

U.S. PATENT DOCUMENTS

| | | | |
|---|---|---|---|
| 7,029,935 B2 | 4/2006 | Negley et al. | |
| 7,259,400 B1 | 8/2007 | Taskar | |
| 7,391,153 B2 | 6/2008 | Suehiro et al. | |
| 2003/0211804 A1 | 11/2003 | Sorg et al. | |
| 2003/0230751 A1* | 12/2003 | Harada | 257/80 |
| 2004/0041222 A1* | 3/2004 | Loh | 257/433 |
| 2004/0075100 A1 | 4/2004 | Bogner et al. | |
| 2004/0256706 A1 | 12/2004 | Nakashima | |
| 2005/0014302 A1 | 1/2005 | Brunner et al. | |
| 2005/0051789 A1* | 3/2005 | Negley et al. | 257/99 |
| 2005/0051792 A1 | 3/2005 | Sasuga | |
| 2005/0057144 A1 | 3/2005 | Morita et al. | |
| 2005/0077531 A1 | 4/2005 | Kim | |
| 2005/0173708 A1* | 8/2005 | Suehiro et al. | 257/79 |
| 2005/0253153 A1* | 11/2005 | Harada | 257/79 |
| 2005/0263777 A1* | 12/2005 | Yano et al. | 257/79 |
| 2006/0001055 A1 | 1/2006 | Ueno et al. | |
| 2006/0012299 A1* | 1/2006 | Suehiro et al. | 313/512 |
| 2006/0022582 A1 | 2/2006 | Radkov | |
| 2006/0054910 A1* | 3/2006 | Takemori et al. | 257/98 |
| 2006/0097385 A1* | 5/2006 | Negley | 257/722 |
| 2006/0102915 A1* | 5/2006 | Kim | 257/98 |
| 2007/0007540 A1* | 1/2007 | Hashimoto et al. | 257/94 |
| 2007/0215892 A1 | 9/2007 | Ishii et al. | |
| 2008/0074032 A1 | 3/2008 | Yano et al. | |
| 2008/0079017 A1* | 4/2008 | Loh et al. | 257/98 |
| 2008/0203420 A1* | 8/2008 | Higaki et al. | 257/99 |
| 2008/0217637 A1 | 9/2008 | Kim et al. | |

FOREIGN PATENT DOCUMENTS

| | | |
|---|---|---|
| EP | 1 1968 016 | 4/2002 |
| EP | 1 411 557 | 4/2004 |
| EP | 1 811 581 | 7/2007 |
| EP | 1 850 399 | 10/2007 |
| JP | 09-045965 | 2/1997 |
| JP | 11-068166 | 3/1999 |
| JP | 2000-208822 | 7/2000 |
| JP | 2001-298216 A | 10/2001 |
| JP | 2002-185048 A | 6/2002 |
| JP | 2002-373950 | 12/2002 |
| JP | 2003-188422 A | 7/2003 |
| JP | 2003-532299 | 10/2003 |
| JP | 2005-093601 | 4/2005 |
| JP | 2006060058 A | 3/2006 |
| JP | 2006-093486 | 4/2006 |
| JP | 2007-184319 A | 7/2007 |
| JP | 2007-201010 | 8/2007 |
| JP | 2012178604 A | 9/2012 |
| KR | 10-2002-0029611 | 4/2002 |
| KR | 10-2004-0021951 A | 3/2004 |
| KR | 10-2004-0044701 | 5/2004 |
| KR | 10-2005-0034936 | 4/2005 |
| KR | 10-2005-0116373 | 12/2005 |
| KR | 10-2006-0120260 | 11/2006 |
| WO | WO 2006/048064 | 5/2006 |

* cited by examiner

LIGHT EMITTING DEVICE PACKAGE AND METHOD FOR MANUFACTURING THE SAME

This application is a continuation of prior U.S. patent application Ser. No. 11/890,543 filed Aug. 7, 2010, which claims the benefit of Korean Patent Application No. 10-2006-0074751, filed on Aug. 8, 2006, Korean Patent Application No. 10-2006-0078635, filed on Aug. 21, 2006, Korean Patent Application No. 10-2006-0130114, filed on Dec. 19, 2006, which are hereby incorporated by references as if fully set forth herein.

BACKGROUND OF THE INVENTION

1. Field of the Invention

The present invention relates to a light emitting device package and a method for manufacturing the same, and more particularly, to a light emitting device package capable of emitting uniform white light and a method for manufacturing the same.

2. Discussion of the Related Art

Light emitting diodes (LEDs) are well known as a semiconductor light emitting device which converts current to light, to emit light. Since a red LED using GaAsP compound semiconductors was made commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band-gap of the semiconductor material representing energy difference between valence-band electrons and conduction-band electrons.

A gallium nitride (GaN) compound semiconductor has been highlighted in the field of high-power electronic devices including light emitting diodes (LEDs) because it exhibits a high thermal stability and a wide band-gap of 0.8 to 6.2 eV. One of the reasons why the GaN compound semiconductor has been highlighted is that it is possible to fabricate semiconductor layers capable of emitting green, blue, and white light, using GaN in combination with other elements, for example, indium (In), aluminum (Al), etc.

Thus, it is possible to adjust the wavelength of light to be emitted, in accordance with the characteristics of a specific apparatus, using GaN in combination with other appropriate elements. For example, it is possible to fabricate a blue LED useful for optical recording or a white LED capable of replacing a glow lamp.

Such a white light source may be fabricated using LEDs for emitting light of three primary colors, namely, red, green, and blue, or using an LED for emitting light of a certain color and phosphors.

In accordance with the method, which uses phosphors, a white light source may be fabricated using a blue LED and yellow phosphors. In this case, white light is produced as blue light emitted from a blue LED and yellow light emitted from yellow phosphors excited by the blue light are mixed.

Similarly, the white light source may be fabricated using a green LED and red phosphors or using an ultraviolet LED and red, green, and blue phosphors.

In accordance with the method, which uses a blue LED and yellow phosphors, to fabricate a white light source, red light and green light are emitted as blue light emitted from the blue LED is absorbed in the yellow phosphors in certain degrees. The red light and green light are mixed with the blue light not absorbed in the yellow phosphors, so that they are viewed in the form of white light to the observer.

The above-mentioned method, which uses a blue LED and yellow phosphors, to fabricate a white light source, are widely used because the fabricated white light source exhibits excellent color rendering, high stability, and high reliability.

FIG. 1 illustrates an LED lamp which emits white light using the above-mentioned LED and phosphors.

In the illustrated LED lamp, a blue LED 3 is disposed on a stack 2 mounted in a reflective cup 1. A filler 5, which is formed by mixing phosphors 4 with a silicon gel or an epoxy resin, is filled in the reflective cup 1 such that the filler 5 encloses the blue LED 3. A glass 6 is arranged over the filler 5.

In this LED lamp structure, however, the filler 5 enclosing the LED 3 may have a non-uniform thickness. For this reason, there may be an optical path length difference between light paths a and b of light emitted from the LED 3 to the surface of the glass 6.

SUMMARY OF THE INVENTION

Accordingly, the present invention is directed to a light emitting device package and a method for manufacturing the same that substantially obviate one or more problems due to limitations and disadvantages of the related art.

An object of the present invention is to provide a light emitting device package capable of emitting light generated from a light source via an external medium while achieving a reduction in optical path length difference, thereby achieving an improvement in the chromatic uniformity at different positions of the light emitting device, and enabling emission of light uniformly changed in wavelength.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device package comprises: a package body; an electrode formed over at least one surface of the package body; a light emitting device mounted over the package body; and a phosphor layer formed over the light emitting device while having a uniform thickness around the light emitting device.

In another aspect of the present invention, a method for manufacturing a light emitting device package comprises: forming a plurality of electrodes over a substrate; bonding light emitting devices to the substrate such that the light emitting devices are connected to the electrodes; forming a phosphor layer over the substrate bonded with the light emitting devices; and dicing the substrate and the phosphor layer into unit packages such that the phosphor layer over an upper surface of the light emitting device in each unit package has a thickness equal to a thickness of the phosphor layer over each side surface of the light emitting device in the unit package.

In still another aspect of the present invention, a method for manufacturing a light emitting device package comprises: forming a barrier rib defining a region surrounding a light emitting device over a mount of a substrate for mounting the light emitting device; mounting the light emitting device over the mount; and filling phosphors inside the barrier rib.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
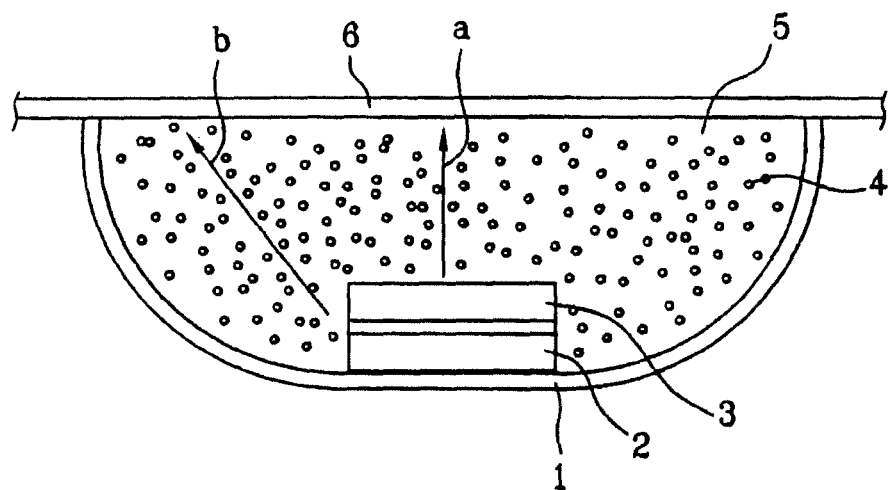
FIG. 1 is a schematic view illustrating a general light emitting device package.

The present invention now will be described more fully hereinafter with reference to the accompanying figures, in which embodiments of the invention are shown.

This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

First Embodiment

Hereinafter, a method for manufacturing a light emitting device package according to a first embodiment of the present invention will be described.

Figure 2:
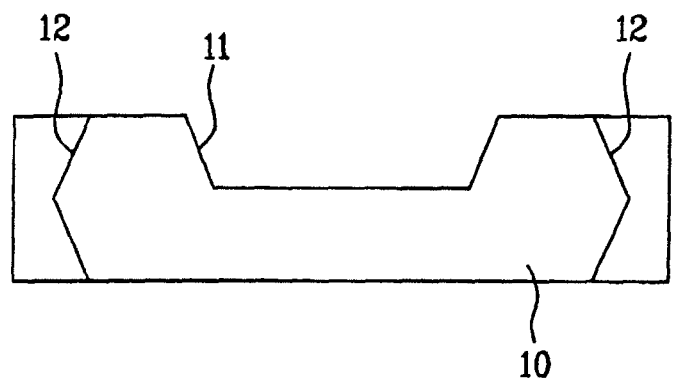
FIGS. 2 to 8 are views illustrating a first embodiment of the present invention.
Figure 7:
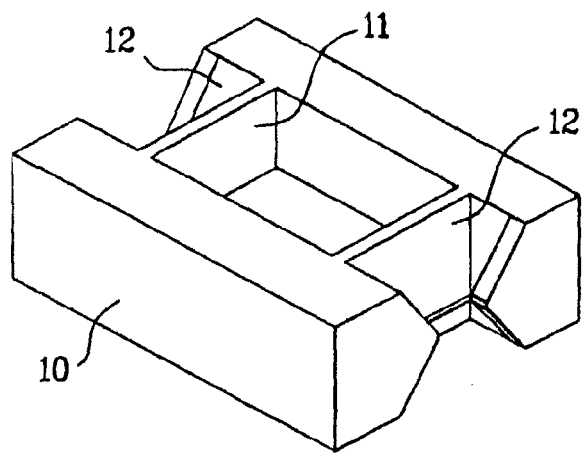

First, a substrate 10, which is provided with a groove-shaped mount 11 formed at an upper surface of the substrate 10, and side grooves 12 formed at opposite side surfaces of the substrate 10, is prepared, as shown in FIG. 2. The structure of the substrate 10 is also illustrated in FIG. 7. For the substrate 10, a silicon substrate or a ceramic substrate may be used. The side grooves 12 may be formed by forming through holes at opposite sides of the substrate 10.

Figure 3:
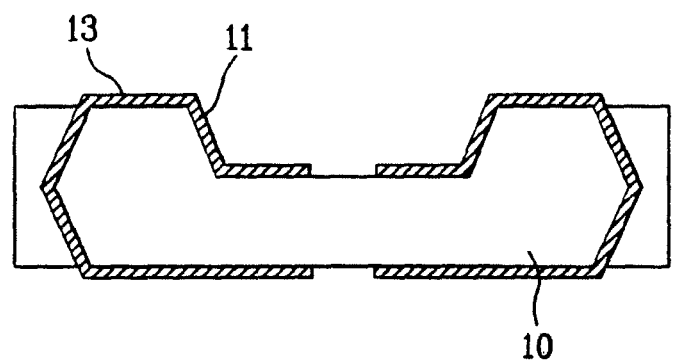

Thereafter, a pair of electrodes 13 are formed at the substrate 10 such that each electrode 13 connects the interior of the mount 11, an associated one of the side grooves 12, and a lower surface of the substrate 10, as shown in FIG. 3.

Figure 4:
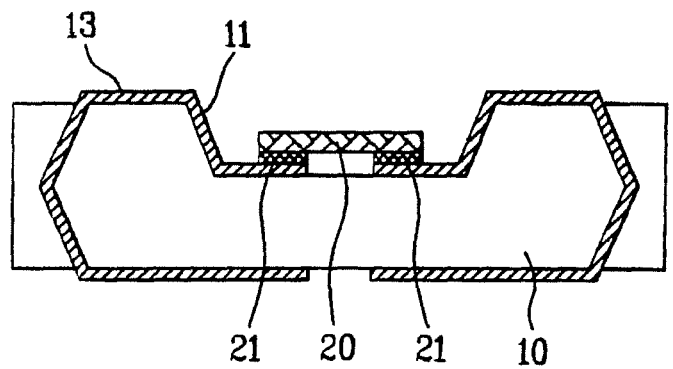

A light emitting device 20 is then bonded on the substrate 10 inside the mount 11 such that the light emitting device 20 is connected to the electrodes 13, as shown in FIG. 4. The bonding of the light emitting device 20 may be achieved using solders 21 applied to respective terminals of the electrodes 13 of the light emitting device 20.

Figure 5:
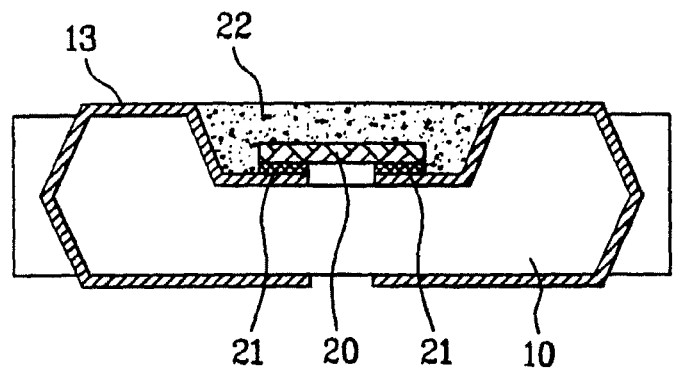

Subsequently, a filler 22 is filled in the interior of the mount 11 such that the filler 22 encloses the light emitting device 20, as shown in FIG. 5. For the filler 22, a transparent material, which allows light to pass therethrough, may be used. For example, a silicon gel or an epoxy resin may be used.

Figure 6:
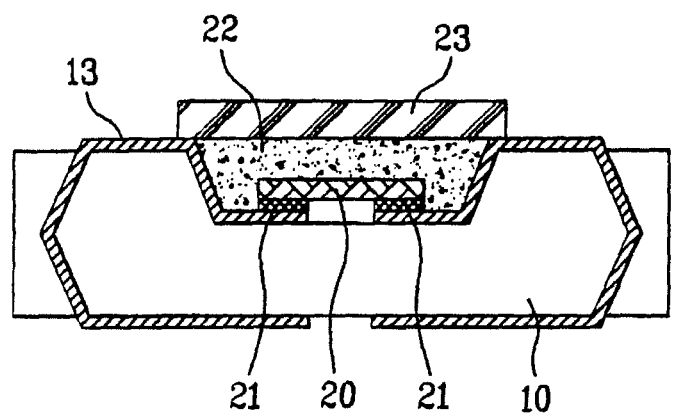

A resin layer 23, in which phosphors are uniformly distributed, is the formed over the filler 22, as shown in FIG. 6. The resin layer 23 may have a uniform thickness. Thus, a light emitting device package is completely manufactured.

In the light emitting device package manufactured as described above, light generated from the light emitting device 20 passes through the resin layer 23, which has a uniform thickness and is dispersed with phosphors, so that the wavelength of the light is uniformly changed. Accordingly, the wavelength-changed light is emitted from the light emitting device package.

For example, where the light emitting device 20 is a blue light emitting device, and the phosphors dispersed in the resin layer 23 are yellow phosphors, blue light generated from the blue light emitting device 20 is mixed with yellow light generated from the yellow phosphors while passing through the resin layer 23. In accordance with the mixing of blue and yellow colors, white light may be emitted from the light emitting device package.

As described above, the mount 11 is formed at the upper surface of the substrate 10. Also, the side grooves 12 are formed at opposite sides of the mount 11.

In order to smoothly form the electrodes 13, each side surface of the substrate 10 has a centrally-protruded shape by inclinedly etching upper and lower portions of the side surface upon forming the associated side groove 12.

The mount 11 also has inclined side walls, so that light emitted from the light emitting device 10 mounted on the bottom surface of the mount 11 can be reflected from the inclined side walls. In this case, it is possible to increase the amount of light output through the top of the package.

Figure 8:
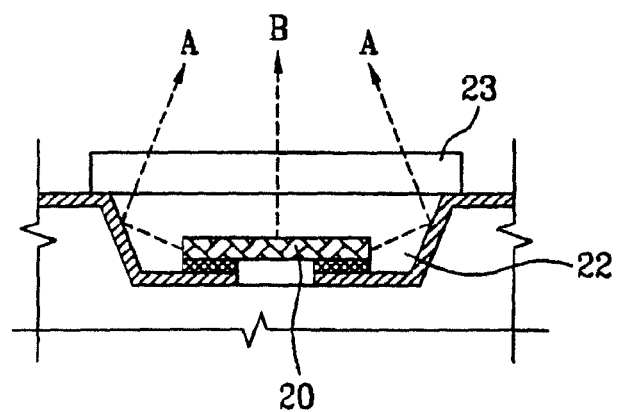

FIG. 8 illustrates optical travel paths in the light emitting device package according to this embodiment. As shown in FIG. 8, light emerging from the top of the light emitting device 20 mounted on the bottom surface of the mount travels along an optical path B, whereas light emerging from each side surface of the light emitting device 20 travels along an optical path A after being reflected by the side surface of the mount 11 facing the side surface of the light emitting device 20.

Accordingly, the light traveling along the optical path A and the light traveling along the optical path B passes through the phosphor-distributed resin layer 23, which has a uniform thickness, so that the wavelength of the light is uniformly changed.

Second Embodiment

Hereinafter, a method for manufacturing a light emitting device package according to a second embodiment of the present invention will be described.

Figure 9:
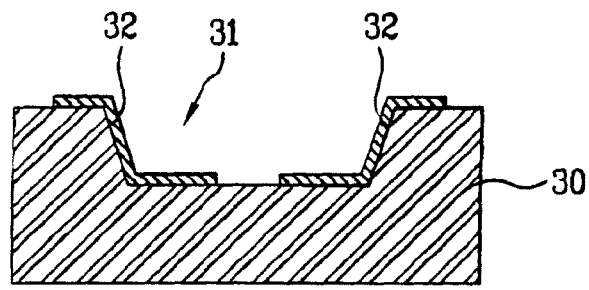
FIGS. 9 to 13 are views illustrating a second embodiment of the present invention.

As shown in FIG. 9, a mounting recess 31 is first formed at an upper surface of a substrate 30. A pair of electrodes 32 are then formed in the mounting recess 31 such that the electrodes 32 extend along side walls of the mounting recess 31 and then extend along the upper surface of the substrate 30.

Figure 10:
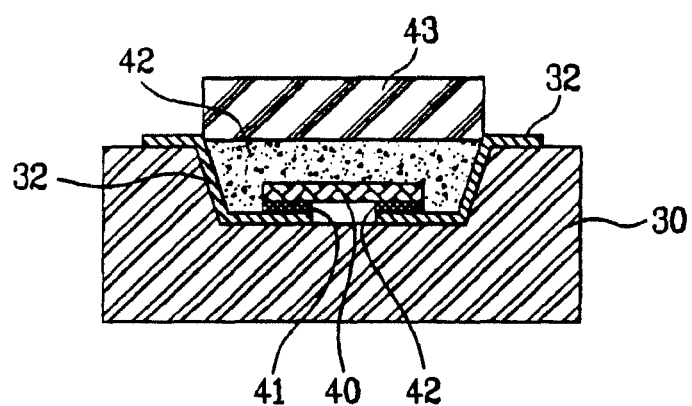

A light emitting device 40 is then bonded on the substrate to portions of the electrodes 32 arranged in the mounting recess 31, as shown in FIG. 10. Subsequently, a filler 42 is filled in the mounting recess 31. A phosphor-distributed resin layer 43 is the formed over the mounting recess 31 filled with the filler 42.

The bonding of the light emitting device 40 may be achieved by bonding terminals of the light emitting device 40 to the electrodes 32 using solders 41, as in the first embodiment as described above.

Figure 11:
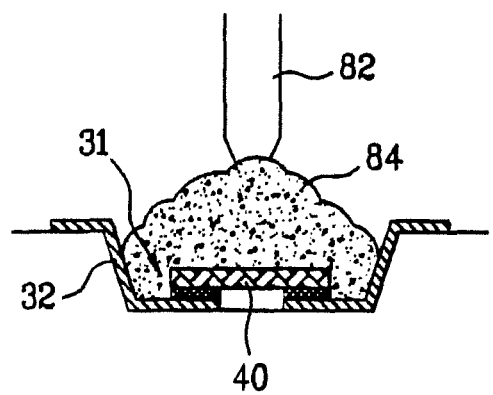

The filling of the filler 42 may be achieved using a dispensing method, as shown in FIG. 11. In accordance with the dispensing method, a nozzle 82, which contains the filler 42, is positioned in the mounting recess 31 above the light emitting device 40. The filler 42 is then discharged from the nozzle 82, to fill the mounting recess 31.

Figure 12:
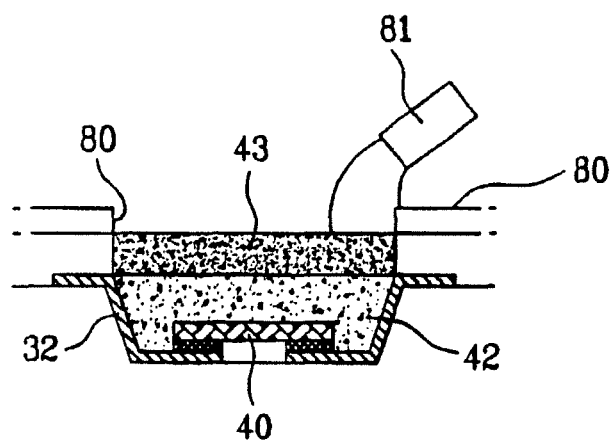

The formation of the resin layer 43 over the filler 42 may be achieved using a screen printing process, as shown in FIG. 12.

In accordance with the screen printing process, a stencil 80 having an opening is first prepared. The stencil 80 is then arranged on the filler 42 such that the filler 42 is exposed through the opening of the stencil 80. Thereafter, a phosphor-distributed resin material is supplied to the opening of the stencil 80 such that the resin material is applied to the filler 42. The resin material is then spread using a squeegee 81 arranged over the stencil 80 such that the resin material forms a film.

Using the above-described screen printing process, it is possible to form the phosphor-distributed resin layer 43 on the filler 42 in the form of a film having a uniform thickness.

Figure 13:
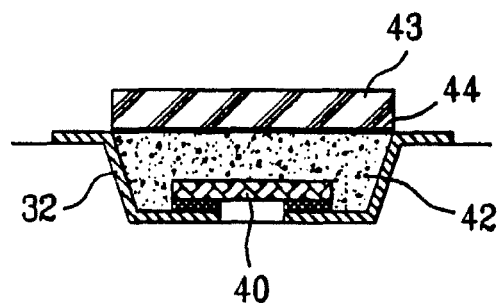

Meanwhile, the resin layer 43 may be formed by separately preparing a phosphor-distributed resin film, and attaching the resin film to an upper surface of the filler 42, as shown in FIG. 13.

The remaining configurations of the second embodiment may be identical to those of the first embodiment, and so, no description thereof will be given.

Third Embodiment

Hereinafter, a method for manufacturing a light emitting device package according to a third embodiment of the present invention will be described.

Figure 14:
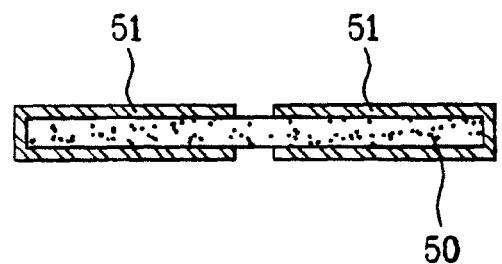
FIGS. 14 to 18 are views illustrating a third embodiment of the present invention.

As shown in FIG. 14, a pair of electrodes 51 are formed at opposite sides of a first substrate 50 such that the upper and lower surfaces of the first substrate 50 are connected by each electrode 51.

Figure 15:
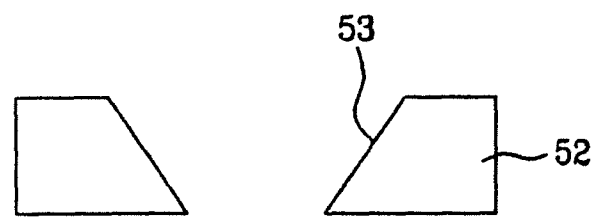

A second substrate 52, which includes a mounting hole 53, as shown in FIG. 15, is prepared.

It is preferred that a reflective film is formed on the mounting hole 53 of the second substrate 52. The reflective film functions to reflect light emerging from a light emitting device, which will be mounted in a subsequent process, and thus to increase the amount of light emitted through the top of the package.

Figure 16:
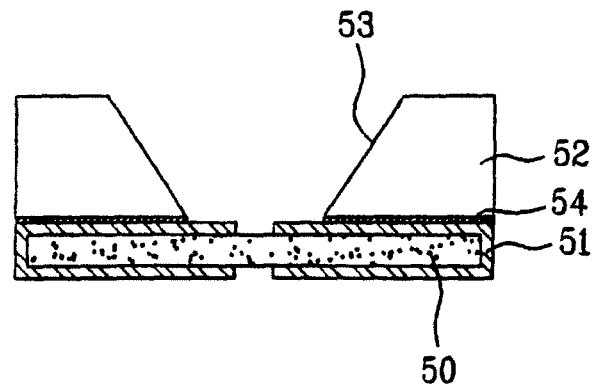

As shown in FIG. 16, the second substrate 52 is attached to the first substrate 50 such that the electrodes 51 are partially exposed through the mounting hole 53. The substrate attachment may be achieved using an adhesive 54 such as an adhesive resin or an adhesive tape.

Figure 17:
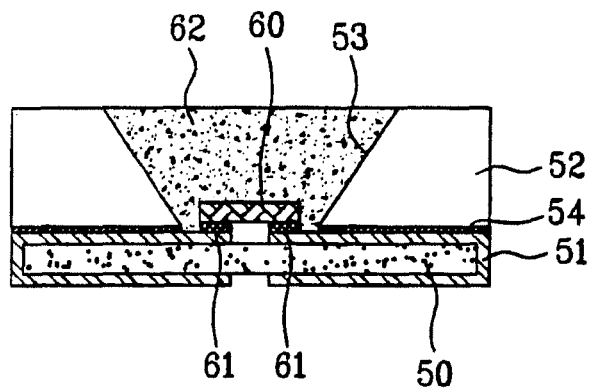

Thereafter, a light emitting device 60 is bonded to the electrodes 51 exposed through the mounting hole 53 of the second substrate 52, as shown in FIG. 17. A filler 62 is then filled in the mounting hole 53.

Figure 18:
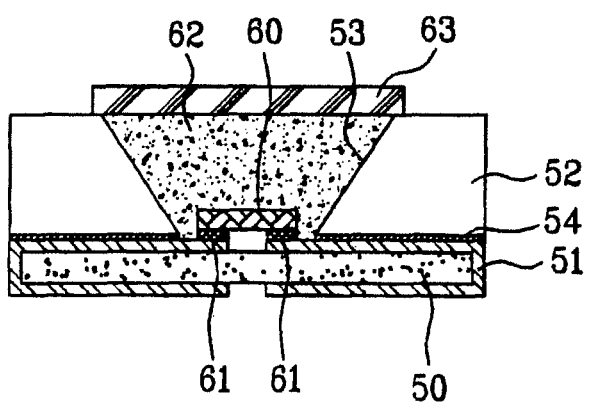

Subsequently, a phosphor-distributed resin layer 63 is formed over the filler 62, as shown in FIG. 18.

For each of the first and second substrates 50 and 52, a silicon substrate or a ceramic substrate may be used. Where a ceramic substrate is used, it is preferred that the substrate is made of a material exhibiting excellent heat conductivity. The substrates may also be made of a material exhibiting excellent thermal insulation, for example, AlN or alumina.

Fourth Embodiment

Figure 19:
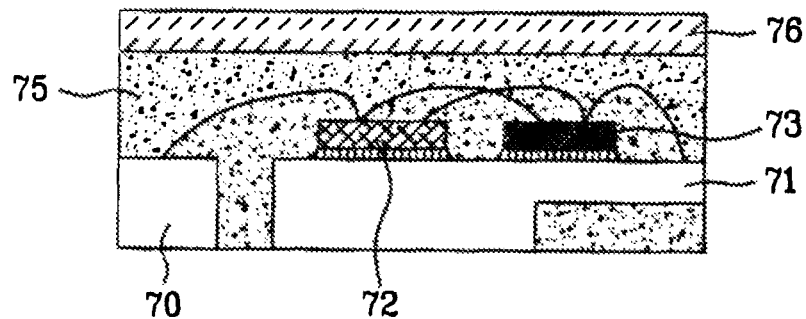
FIG. 19 is a view illustrating a fourth embodiment of the present invention.

FIG. 19 illustrates a light emitting device package according to a fourth embodiment of the present invention. In particular, FIG. 19 shows a state in which a zener diode 73 is mounted together with a light emitting device 72, to achieve an improvement in voltage withstand characteristics.

In accordance with this embodiment, the light emitting device 72 and zener diode 73 are bonded using wires in a state in which a pair of leads 70 and 71 are formed in a package body. A filler 75 is formed over the light emitting device 72 and zener diode 73. A phosphor-distributed resin layer 76 is also formed over the filler 75.

Where a package is configured by connecting the zener diode 73 and light emitting device 72 in parallel, as described above, over-current generated when a surge voltage is applied to the light emitting device 72, which exhibits inferior voltage withstand characteristics, namely, inferior resistance to static electricity, does not flow toward the light emitting device 72. That is, a zener breakdown occurs in the zener diode 73 near a zener voltage due to the over-current, thereby causing the over-current to be bypassed through the zener diode 73. Thus, the light emitting device 72 is protected from the over-current.

Fifth Embodiment

Figure 20:
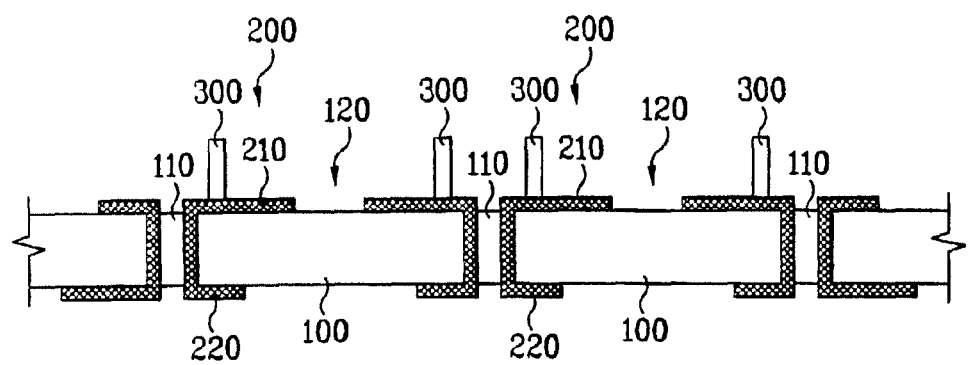
FIGS. 20 to 22 are views illustrating a fifth embodiment of the present invention.
Figure 21:
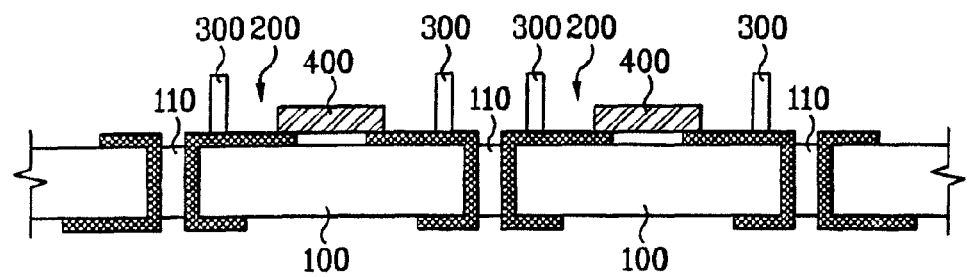
Figure 22:
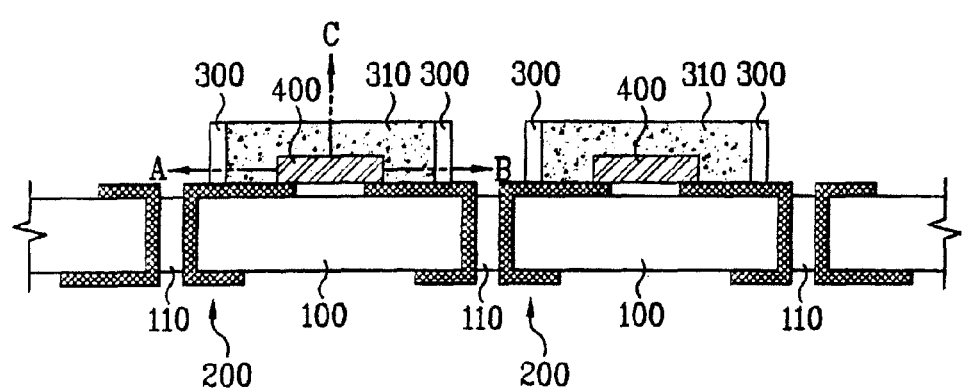

FIGS. 20 to 22 illustrate procedures for manufacturing a light emitting device package according to a fifth embodiment of the present invention.

In accordance with the fifth embodiment, through holes 110 are first formed through a substrate 100 using a laser or an etching method, as shown in FIG. 20. The substrate 100 may be one of a ceramic substrate or a silicon substrate to be used for a 2D sub-mount or a package for a light emitting device.

The substrate 100, which is formed with the through holes 110, as described above, forms a package body.

Thereafter, electrodes 200 to be connected to mounts 120, on which light emitting devices will be mounted, are formed on the surface of the substrate 100.

Each electrode 200 has a structure connected between the front and back surfaces of the substrate 100 using a metal line. That is, each electrode 200 includes a front-side electrode 210 connected to a light emitting device, and a back-side electrode 220 formed at the back surface of the substrate 100 and connected to the front-side electrode 210 via one through hole 110.

The back-side electrode 220 may be electrically connected to an external circuit functioning to supply current to a light emitting device. In this case, it is preferred that the through holes 110 be formed in an isolation region of the package.

Uniformly-spaced barrier ribs 300 exhibiting excellent light transmissivity are formed at the front surface of the substrate 100, on which light emitting devices 400 will be mounted.

The barrier ribs 300 may be made of a photosensitive polymer. That is, the formation of the barrier ribs 300 can be achieved by coating a photosensitive polymer over the front surface of the substrate 100, and performing a photolithography process such that the photosensitive polymer remains in a region where the barrier ribs 300 will be formed, while being removed in other regions.

Alternatively, the barrier ribs 300 may be formed by separately fabricating barrier ribs using a material exhibiting excellent light transmissivity, for example, glass, and bonding the fabricated barrier ribs to the substrate 100.

After the manufacture of the sub-mount or package as described above, the light emitting devices 400 are bonded to the sub-mount or package, as shown in FIG. 21.

A filler 310, such as a phosphor-containing epoxy resin or silicon gel, is then filled in spaces between the barrier ribs 300 and the light emitting devices 400, as shown in FIG. 22.

It is preferred that the height difference between each barrier rib 300 and the upper surface of each light emitting device 400 be equal to the distance between the barrier rib 300 and the side surface of the light emitting device 400 facing the barrier rib 300.

Accordingly, there is no optical path length difference between light emitted from the side surface of the light emitting device 400 along a path A in FIG. 22 and light emitted from the upper surface of the light emitting device 400 along a path B in FIG. 22. Thus, a uniform light distribution is obtained.

For each light emitting device 400, any of a horizontal type light emitting device and a vertical type light emitting device can be used.

Subsequently, lenses (not shown) may be mounted to the substrate 100 packaged with the light emitting devices 400. The substrate 100 is then divided into individual packages.

Sixth Embodiment

Figure 23:
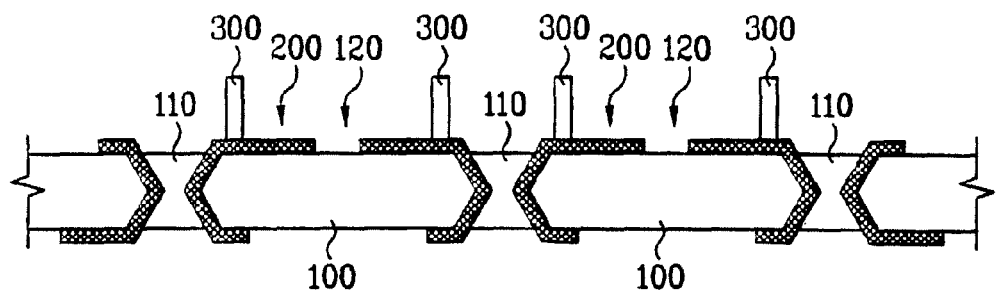
FIGS. 23 to 25 are views illustrating a sixth embodiment of the present invention.
Figure 24:
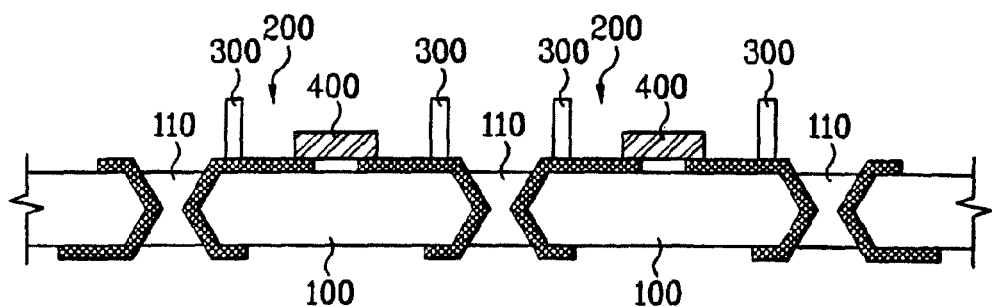
Figure 25:
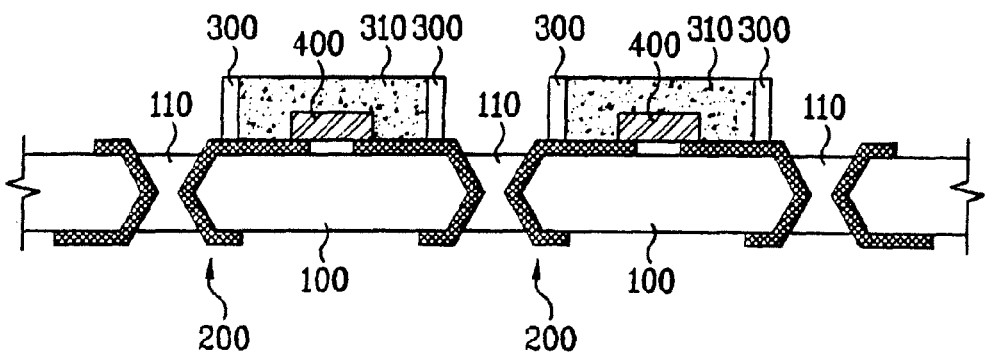

FIGS. 23 to 25 illustrate procedures for manufacturing a light emitting device package according to a sixth embodiment of the present invention.

In accordance with the sixth embodiment, through holes 110 are first formed through a silicon substrate 100 using a solution enabling anisotropic etching, for example, a KOH or tetramethyl ammonium hydroxide (TMAH) solution, as shown in FIG. 23. The substrate 100 may be used for a sub-mount or a package for a light emitting device.

Where the through holes 110 are formed in accordance with an etching process, as described above, they have a structure as shown in FIG. 23. The etching for the formation of the through holes 110 is carried out at both the front and back surfaces of the substrate 100 such that the etched front and back portions of the substrate 100 to form each through hole 110 are connected.

Thereafter, electrodes 200 to be connected to mounts 120, on which light emitting devices will be mounted, are formed on the surface of the substrate 100.

As in the fifth embodiment described above, each electrode 200 may include a front-side electrode 210 connected to a light emitting device, and a back-side electrode 220 formed at the back surface of the substrate 100 and connected to the front-side electrode 210 via one through hole 110.

Subsequently, barrier ribs 300 are formed, and light emitting devices 400 are mounted to the mounts 120, as shown in FIG. 24.

A filler 310 is then filled in spaces defined by the barrier ribs 300 inside the barrier ribs 300, as shown in FIG. 25. Subsequent procedures are identical to those of the fifth embodiment.

Seventh Embodiment

Figure 26:
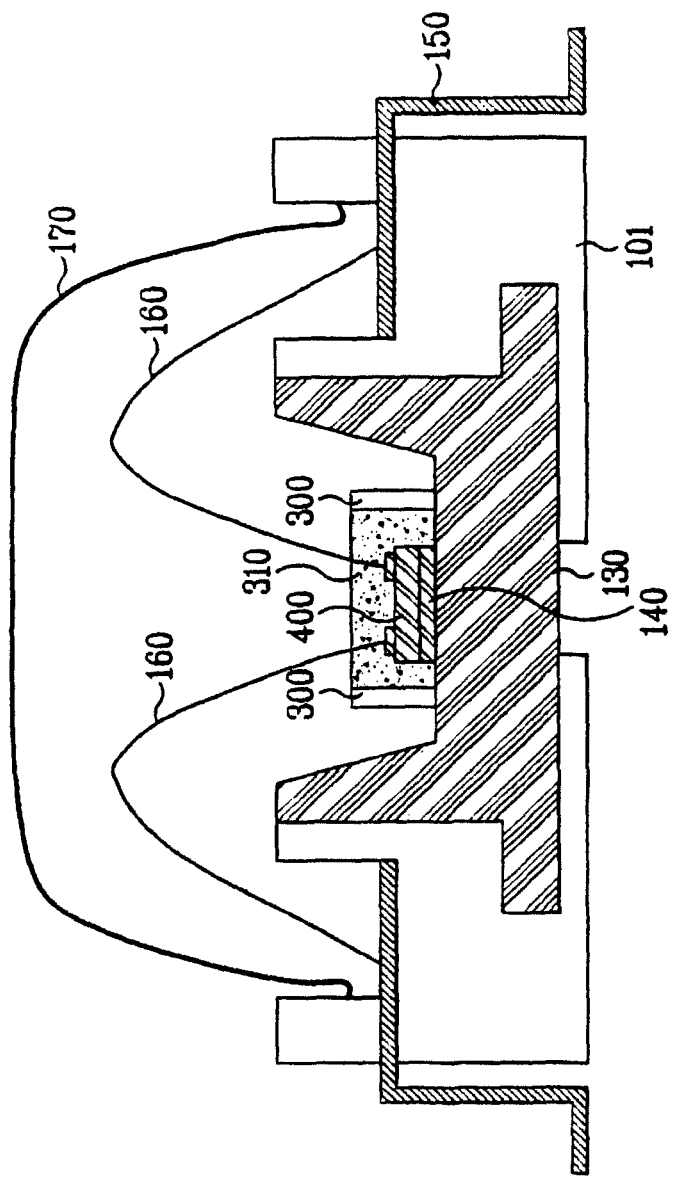
FIG. 26 is a view illustrating a seventh embodiment of the present invention.

FIG. 26 illustrates a light emitting device package according to a seventh embodiment of the present invention.

In the illustrated light emitting device, a light emitting device 400 is bonded to an aluminum slug 130 having a mirror surface, using an adhesive 140. A barrier rib 300 is formed around the light emitting device 400, using a material exhibiting excellent light transmissivity.

A filler 310, such as a phosphor-containing epoxy resin or silicon gel, is filled between the barrier rib 300 and the light emitting device 400.

The electrodes of the light emitting device 400 is electrically connected to leads 150 fixed to a package body 101, using conductive wires 160.

A lens 170 is formed on or directly attached to an upper surface of the package body 101, on which the light emitting device 400 is mounted.

It is preferred that the height difference between the barrier rib 300 and the upper surface of the light emitting device 400 be equal to the distance between the barrier rib 300 and the side surface of the light emitting device 400 facing the barrier rib 300.

Eighth Embodiment

Figure 27:
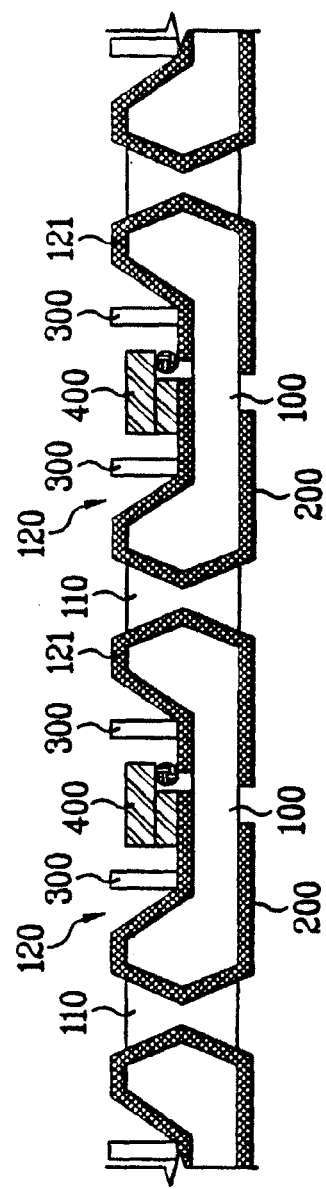
FIGS. 27 and 28 are views illustrating an eighth embodiment of the present invention.
Figure 28:
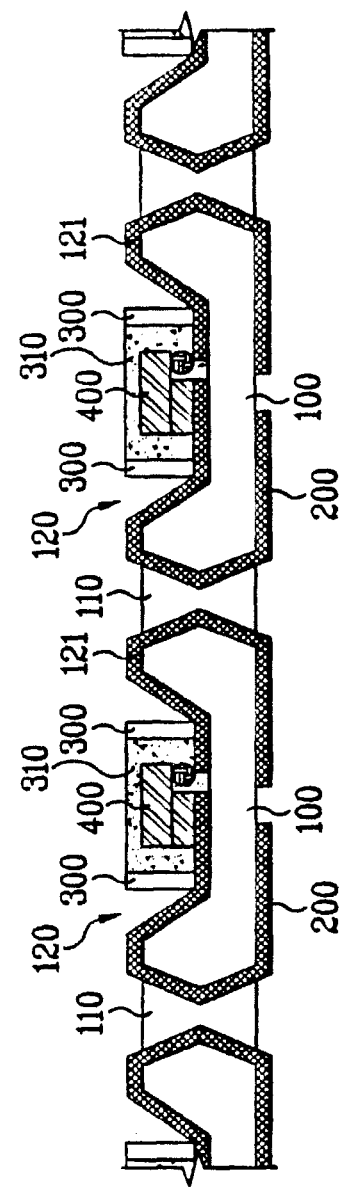

FIGS. 27 and 28 illustrate procedures for manufacturing a light emitting device package according to an eighth embodiment of the present invention.

In accordance with this embodiment, through holes 110 are first formed through a substrate 100 using a laser or an etching method, as shown in FIG. 27. The substrate 100 may be one of a ceramic substrate or a silicon substrate to be used for a sub-mount or a package for a light emitting device. Mounts 120, on which light emitting devices will be mounted, are also formed at the substrate 100

As shown in FIG. 27, each mount 120 has a recess structure formed as the substrate 100 is recessed in accordance with an etching process. By virtue of such a structure, each mount 120 can upwardly reflect light emitted from each side surface of the light emitting device.

The substrate 100, which is formed with the through holes 110, as described above, forms a package body.

Thereafter, electrodes 200 are formed on the substrate 100 such that each electrode 200 has a structure connected between the front and back surfaces of the substrate 100 using a metal line.

In this case, it is preferred that the through holes 110 be formed in an isolation region of the package.

Uniformly-spaced barrier ribs 300 exhibiting excellent light transmissivity are formed at the front surface of the substrate 100, on which light emitting devices 400 will be mounted.

The barrier ribs 300 may be made of a photosensitive polymer. That is, the formation of the barrier ribs 300 can be achieved by coating a photosensitive polymer over the front surface of the substrate 100, and performing a photolithography process such that the photosensitive polymer remains in a region where the barrier ribs 300 will be formed, while being removed in other regions. Alternatively, the barrier ribs 300 may be formed by separately fabricating barrier ribs using a material exhibiting excellent light transmissivity, for example, glass, and bonding the fabricated barrier ribs to the substrate 100.

After the manufacture of the sub-mount or package as described above, the light emitting devices 400 are mounted to the sub-mount or package in accordance with, for example, a flip chip bonding process.

That is, each light emitting device 400 may be bonded to the associated electrode 200 in a state in which the light emitting device 400 has a structure inverted from a horizontal structure. In this case, a zener diode (not shown) may be provided at the electrode 200.

Thereafter, a filler 310, such as a phosphor-containing epoxy resin or silicon gel, is filled in spaces between the barrier ribs 300 and the light emitting devices 400, as shown in FIG. 22.

It is preferred that the height difference between each barrier rib 300 and the upper surface of each light emitting device 400 be equal to the distance between the barrier rib 300 and the side surface of the light emitting device 400 facing the barrier rib 300.

Accordingly, the lengths of the optical paths of light beams emitted from the light emitting device 400 through phosphors are substantially equal, as in the above-described embodiments.

The light emitted from each side surface of the light emitting device 400 is changed in wavelength while passing through the phosphors. In this case, the emitted light then passes through the barrier rib 300 because the barrier rib 330 exhibits excellent light transmissivity. The light emerging from the barrier rib 330 is then reflected by a side wall 121 of the mount 120 such that it is upwardly directed.

A separate reflective film (not shown) may be formed on the side wall 121 of the mount 120.

Ninth Embodiment

Figure 29:
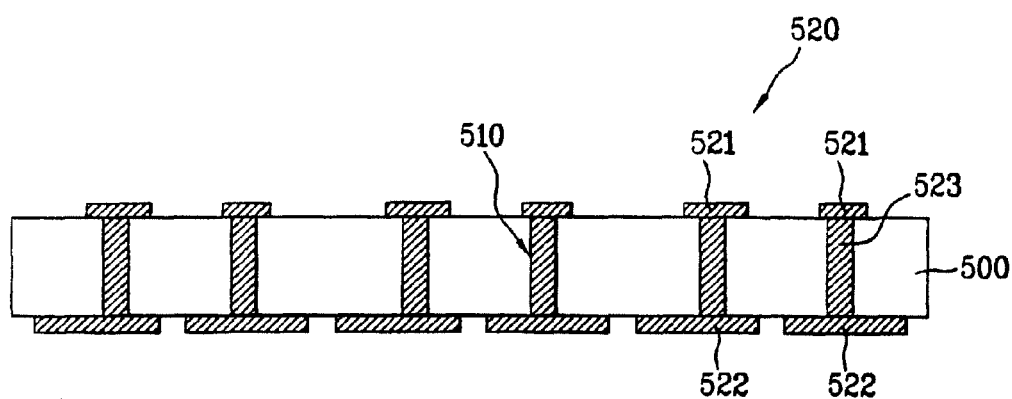
FIGS. 29 to 33 are views illustrating a ninth embodiment of the present invention.
Figure 30:
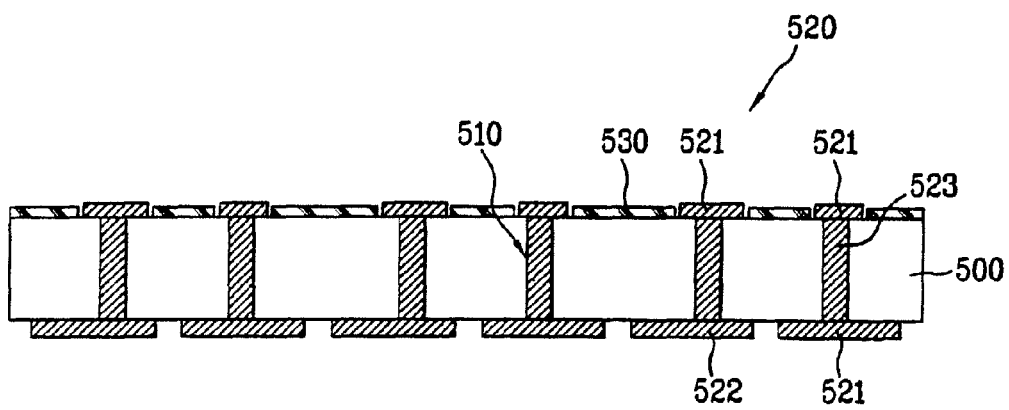

In a procedure for manufacturing a light emitting device package in accordance with a ninth embodiment of the present invention, electrodes 520, each of which includes a pair of electrode structures, are formed on a substrate 500, as shown in FIG. 29.

Each electrode 520 may include an upper electrode (front-side electrode) 521, to which a light emitting device will be coupled at desired electrical and structural strengths, and a lower electrode (back-side electrode) 522, which will be coupled to a structure for supplying an external voltage, for example, a printed circuit board (PCB) substrate, at desired electrical and structural strengths.

The upper electrode 521 and lower electrode 522 of each electrode 520 may be connected by a connecting electrode 523 formed in a through hole 510. The through hole 510 may be formed through the substrate 500 in accordance with a bulk etching process.

For the formation of the electrodes 520 on the substrate 500, a mask layer (not shown) is first formed on the substrate 500. Alternatively, a mask pattern required for bulk-etching of regions, where through holes 510 will be formed, is formed on the substrate 500 in a state in which a mask layer has been formed on the substrate 500.

Using the mask pattern, the substrate 500 is bulk-etched (bulk-micromachined), to form the through holes 510.

The substrate 500 may include a silicon substrate, or substrates made of other materials, namely, aluminum, aluminum nitride (AlN), aluminum oxide ($AlG_x$), photo sensitive glass (PSG), $Al_2O_3$, BeO, or PCB.

For the bulk-etching process, which is adapted to form the through holes 510, a wet etching process, a dry etching process, or a laser drilling process may be used.

A representative of the dry etching process may be a dip reactive ion etching process.

In the etching process for the formation of the through holes 510, a mask layer (not shown) is needed to define a region to be etched and a region to be prevented from being etched. The mask layer should be made of a material capable of exhibiting a mask function for a prolonged period of time in a dry or wet etching process. For the mask layer, a silicon nitride film or a silicon oxide film may be used.

Meanwhile, in order to divide the upper electrodes 521 into positive and negative electrodes and to divide the lower electrodes 522 into positive and negative electrodes, it is preferred that the through holes 510, each of which electrically connects the upper and lower electrodes 521 and 522 of the associated electrode 520, be divided into two groups of through holes, namely, through holes for positive electrodes and through holes for negative electrodes.

Thereafter, an insulation layer for electrical insulation (not shown) is formed on the overall surface of the substrate 500. For the formation of the insulation layer, the mask layer (not shown) used to form the through holes 510 is removed in this embodiment. A silicon oxide film exhibiting excellent insulation characteristics is then formed on the overall surface of the substrate 500 in accordance with a thermal oxidation method.

A silicon nitride film may be deposited for the insulation layer (not shown), using an insulation layer formation method other than the above-described method, for example, a low pressure chemical vapor deposition (LPCVD) method or a plasma enhanced chemical vapor deposition (PECVD) method.

The insulation layer may be dispensed with in the case in which the substrate 500 is made of an insulation material such as an aluminum nitride (AlN) or an aluminum oxide ($AlO_x$).

Thereafter, the formation of the electrodes 520 on the structure formed with the through holes 510 is carried out in accordance with a patterning process.

For the formation of the electrodes 520, which are laterally separated from one another, a photoresist is first coated over the front or back surface of the substrate 500. Light exposure and development are then carried out.

A metal for the formation of the electrodes 520 is then deposited on the front or back surface of the substrate 500 in accordance with a sputtering method or an E-beam evaporation method. Before the deposition of the metal, a seed metal may be deposited.

The deposited metal is then lifted off, to form the electrodes 520 on the front or back surface of the substrate 500.

Thereafter, a seed metal (not shown) is deposited over the surface of the substrate 500 opposite to the metal-deposited surface. The electrodes 520 are then formed on the seed metal. Subsequently, photoresist coating, light exposure, and development are sequentially carried out, to separate the electrodes 520 into positive and negative electrodes.

A patterning process is then carried out to form connecting electrodes 523 in the through holes 510 in accordance with an electroplating method or an electroless-plating method, and thus to connect the front-side electrodes 521 and the back-side electrodes 522 via the connecting electrodes 523.

Meanwhile, the seed metal may be etched to separate adjacent ones of the electrodes 521 and 522 to be laterally separated from each other, and thus to make the adjacent electrodes form electrode pairs. The seed metal should exhibit excellent electrical characteristics, and a high adhesion force to the insulation layer. For an adhesion layer of the seed metal, generally, titanium (Ti), chromium (Cr), or tantalum (Ta) exhibiting a high adhesion force to a silicon oxide film, which is mainly used as an insulation layer, may be used.

Gold (Au), copper (Cu), or aluminum (Al) may be used which is a representative electrode metal exhibiting excellent electrical characteristics while being easily depositable in a semiconductor process.

The electrode metal is exposed to a high temperature condition in a subsequent procedure, in particular, a process for coupling module elements. For this reason, Ti or Cr, which is the material of the adhesion layer, may be diffused into Au, thereby degrading the electrical characteristics of Au. To this end, a diffusion barrier layer made of, for example, platinum (Pt) or nickel (Ni), may be interposed between the adhesion layer of Ti or Cr and the Au layer. Thus, the electrodes 520 may have a structure of Ti/Pt/Au, Cr/Ni/Au, or Cr/Cu/Ni/Au.

After the formation of the electrodes 520, a reflective layer 530 may be formed on the upper surface of the substrate 500, in order to achieve an enhancement in the extraction efficiency of light emitted from the light emitting device, which will be subsequently mounted.

The reflective layer 530 may be made of a material exhibiting an excellent reflectivity, for example, aluminum (Al) or silver (Ag).

The formation of the reflective layer 530 may be achieved by coating a photoresist over the upper surface of the substrate 500, patterning the coated photoresist in accordance with light exposure and development such that the bottom surface the substrate 500, on which the light emitting device will be mounted, is exposed, depositing a reflective material in accordance with a sputtering method or an E-beam evaporation method, and lifting off the patterned photoresist.

Alternatively, the reflective layer 530 may be formed by depositing a reflective material over the upper surface of the substrate 500, and then etching unnecessary portions of the deposited reflective material.

The reflection layer 530 should be formed to prevent it from being connected to or overlapped with both the electrodes of each electrode pair, in order to prevent electrical short circuit. In order to enable the reflective layer 530 to adhere to the electrodes 520 of the light emitting devices, it is also preferred that the reflective layer 530 should not be present on the electrodes 520 in regions where solders or Au stud pumps 611 (FIG. 31) will be formed.

Hereinafter, subsequent procedures will be described in conjunction with the case in which the reflective film 530 is not formed.

Figure 31A:
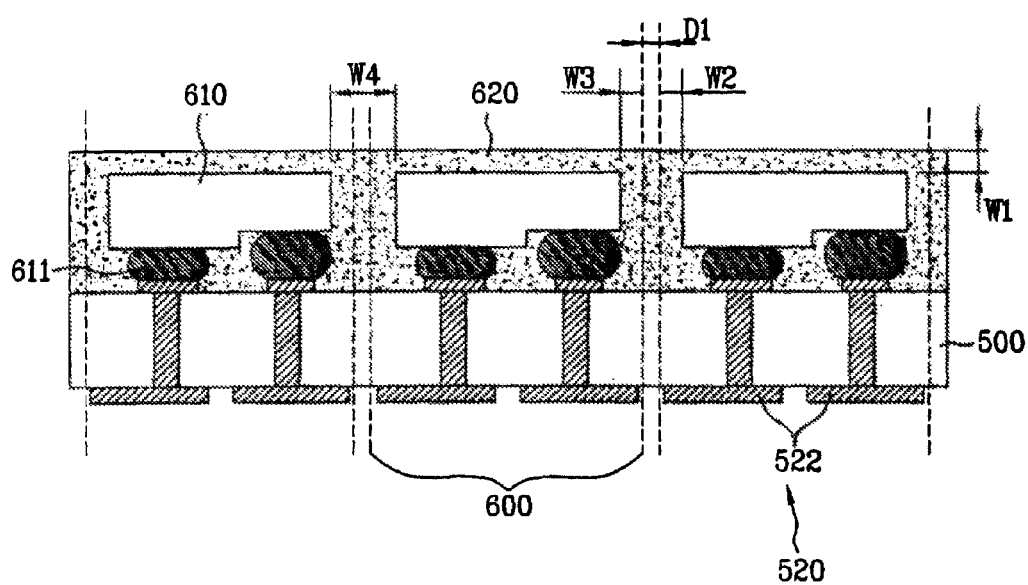

Next, a plurality of light emitting devices 610 are bonded to respective pairs of the electrodes 520, in accordance with a bonding method using conductive solders or Au studs 611, as shown in FIG. 31A.

FIG. 31A illustrates the case in which the light emitting devices 610 are flip-chip-bonded. If necessary, horizontal or vertical type light emitting devices may be wire-bonded.

Thereafter, a phosphor layer 620 are uniformly formed over the substrate 500, to which the light emitting devices 610 have been bonded, such that the phosphor layer 620 covers all the light emitting devices 610.

The phosphor layer 520 may be made of a material consisting of a transparent medium and phosphor powder contained in the transparent medium. For the transparent medium, a resin material, such as an epoxy resin or a silicon gel, may be used.

The phosphor powder may be a phosphor material which absorbs light emitted from the light emitting devices 610, and emits light having energy lower than that of the light emitted from the light emitting devices 610. For example, the phosphor powder may be a yellow phosphor material emitting yellow light. Each light emitting device 610 may be a blue light emitting device. In this case, white light can be emitted in accordance with a mixture of the light emitted from the blue light emitting device and the light emitted from the yellow phosphor material.

The phosphor layer 620 is evenly filled such that it has a constant thickness W1 over the upper surface of each light emitting device 610. Also, the spacing W4 between the adjacent light emitting devices 610 is also adjusted such that the phosphor layer 620 is formed to have a uniform thickness on all the light emitting surfaces of each light emitting device 610, namely, the upper and side surfaces of each light emitting device 610 (W1=W2=W3).

The spacing W4 between the adjacent light emitting devices 610 may be determined, taking into consideration the width D1 of a portion of the substrate 500 or phosphor layer 620 to be removed between adjacent packages 600 when the package structure including the substrate 500 and phosphor layer 620 is diced into individual packages 600.

The spacing W4 between the adjacent light emitting devices 610 may correspond to a length obtained by adding the width D1, to be removed in the dicing process, to two times the thickness of the phosphor layer 620 present on the upper surface of each light emitting device 610 (W4=2×W1+D1).

Accordingly, the spacing W4 between the adjacent light emitting devices 610 may correspond to a length obtained by adding the width D1, to be removed in the dicing process, to two times the distance W1, W2, or W3 between the outer surface of the light emitting device 610 and the outer surface of the phosphor layer 620 in each diced package 600 (W4=2×W1+D1=2×W2+D1=2×W3+D1, or W4=W2+W3+D1).

If the width D1, to be removed between the adjacent packages 600 in the dicing process, is negligible, the spacing W4 between the adjacent light emitting devices 610 may substantially correspond to two times the distance W1, W2, or W3 between the outer surface of the light emitting device 610 and the outer surface of the phosphor layer 620 in each diced package 600 (W4=2×W1=2×W2=2×W3, or W4=W2+W3).

In this case, accordingly, the spacing W4 between the adjacent light emitting devices 610 may substantially correspond to two times the thickness W1 of the phosphor layer 620 over the upper surface of each light emitting device 610 (W4=2×W1).

Meanwhile, the phosphor layer 620 may be made of a mixture of a silicon gel or an epoxy resin having excellent light transmissivity and phosphor powder.

The solders for bonding of the light emitting devices 610 may be formed, using gold-tin (AuSn), lead-tin (PbSn), or indium (In), in accordance with an E-beam evaporation method.

Figure 31B:
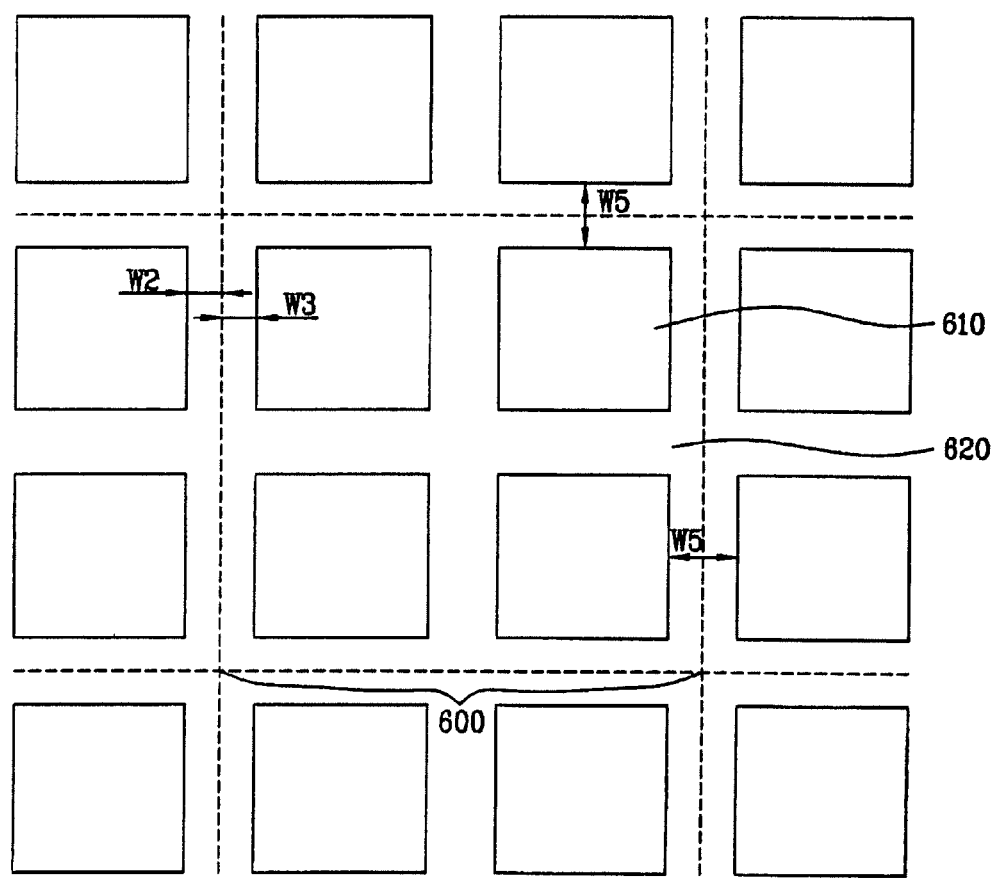

Meanwhile, the package structure may be diced such that a plurality of light emitting devices 610 constitute one package, as shown in FIG. 31B. For example, the package structure may be diced such that four light emitting devices 610 constitute one package, as shown in FIG. 31B. Of course, each package may include two, six, or other numbers of light emitting devices 610.

In such cases, the spacing between the adjacent light emitting devices 610 may be different from that of FIG. 31A. In such cases, the spacing W5 between adjacent package 600 satisfies the above-described conditions.

For example, where four light emitting devices 610 constitute one package 600, the spacing W5 between the adjacent packages 600 may correspond to two times the distance W2 or W3 between the outer surface of each light emitting device 610 and the outer surface of the phosphor layer 620 in each diced package 600.

In this case, the spacing W5 between the adjacent packages 600 may correspond to two times the thickness W1 of the phosphor layer 620 over the upper surface of each light emitting device 610.

On the other hand, when the spacing W5 between the adjacent packages 600 is determined, taking into consideration the width (not shown) to be removed between the adjacent package 600 in the dicing process, the spacing W5 may correspond to a length obtained by adding the width, to be removed between the adjacent package 600 in the dicing process, to two times the distance W2 or W3 between the outer surface of each light emitting device 610 and the outer surface of the phosphor layer 620 in each diced package 600.

In this case, the spacing W5 between the adjacent packages 600 may correspond to a length obtained by adding the width, to be removed in the dicing process, to two times the thickness of the phosphor layer 620 present on the upper surface of each light emitting device 610.

Figure 32:
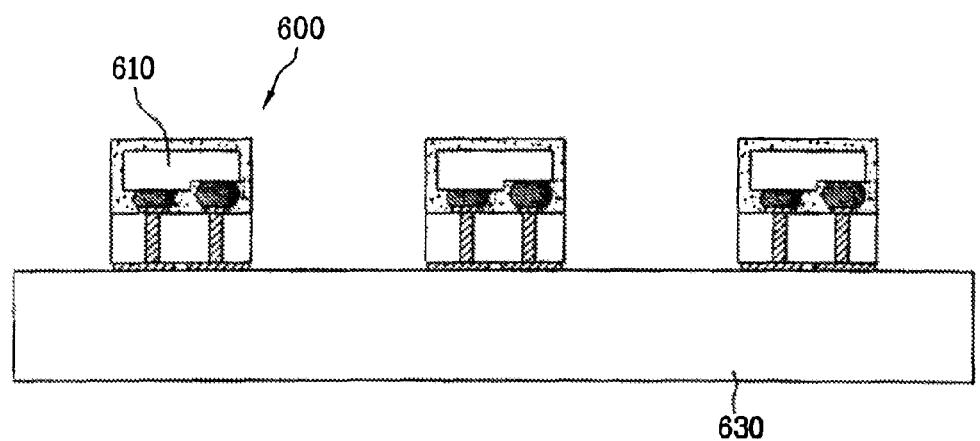

Thereafter, as shown in FIG. 32, the light emitting device package structure in a wafer size is diced into individual packages 600 such that the phosphor layer is present on the upper and side surfaces of the light emitting device 610 in each package 600 while having a uniform thickness (W1=W2=W3).

The individual packages 600, which are obtained in accordance with the dicing process, may be bonded to a PCB substrate 630 at desired electrical and structural strengths, so as to be used for various purposes, for example, backlight units or illumination lamps.

Figure 33:
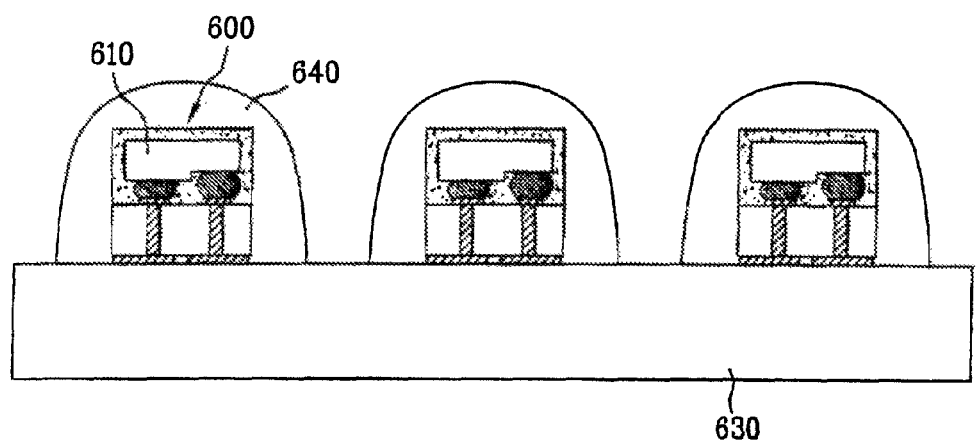

If necessary, each package 600 may include a lens 640 having a shape designed to control the distribution of light emitted from the light emitting device 610 or to achieve an enhancement in light efficiency, as shown in FIG. 33.

Tenth Embodiment

Figure 34:
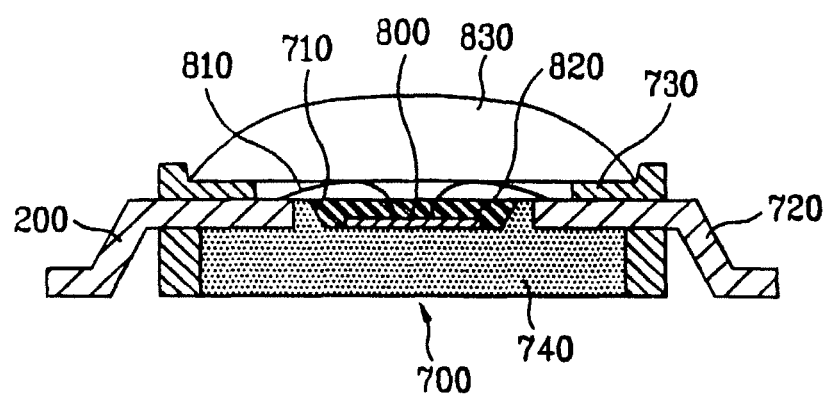
FIGS. 34 to 38 are views illustrating a tenth embodiment of the present invention.

In a package according to a tenth embodiment of the present invention, as shown in FIG. 34, a light emitting device 800 is mounted to a package body 700 formed with a mount 710.

The package body 700 includes an upper frame made of a plastic material and coupled to a lead 720, and a lower frame 740 arranged beneath the mount 710 and coupled to the upper frame 730.

The lower frame 740 is made of a conductive material such as aluminum, in order to function as a heat sink.

In this structure, the light emitting device 800 is electrically connected to the lead 720 via a wire 810. A filler 820 is filled in the mount 710, on which the light emitting device 800 is mounted. The filler 820 may contain phosphors.

For example, phosphors may be mixed with an epoxy resin or silicon gel, and the resulting mixture is filled in the mount 710, as the filler 820.

For an example of a combination of the light emitting device 800 and phosphors, a blue light emitting device, which emits blue light, may be used for the light emitting device 800, and phosphors, which partially absorbs the blue light, thereby emitting yellow light, may be used.

In this case, it is possible to realize a white light emitting device package capable of emitting white light in accordance with a mixture of blue light and yellow light. For the blue light emitting device 800, a gallium nitride (GaN)-based light emitting device may be used. In addition, light emitting devices and phosphors emitting light of various colors may be used.

A lens 830 may be arranged over the mount 710 filled with the filler 820.

Figure 35:
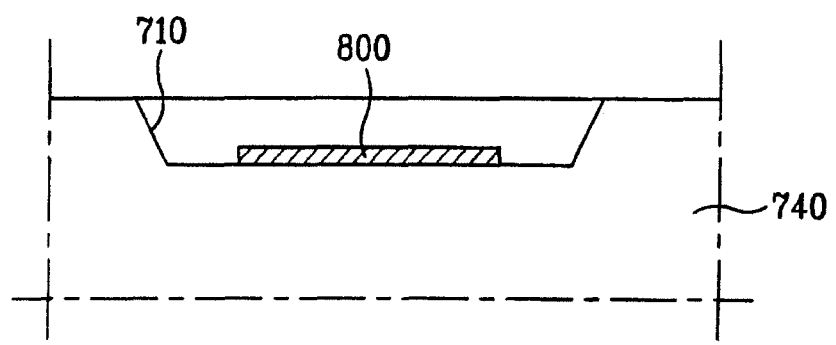

FIG. 35 is an enlarged view showing the mount 710, on which the light emitting device 800 is mounted.

Figure 36:
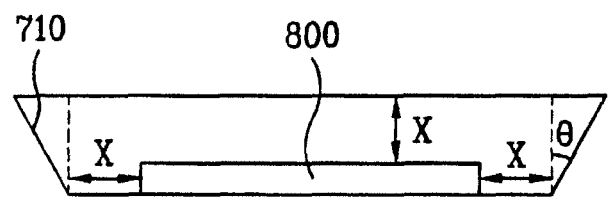
Figure 37:
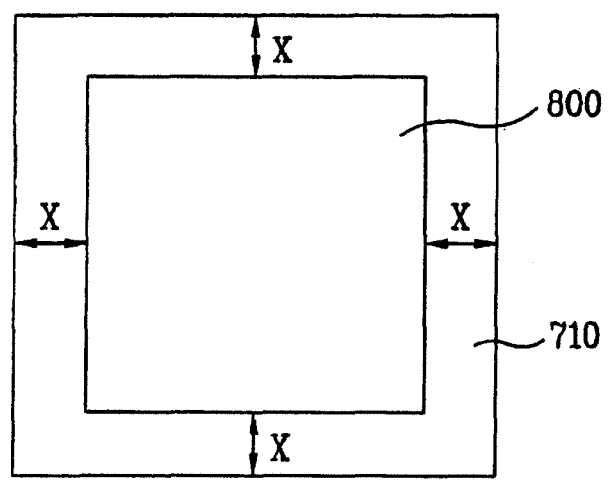

As shown in FIGS. 36 and 37, the mount 710, on which the light emitting device 800 is mounted, is formed such that the height X from the upper surface of the light emitting device 800 is equal to a horizontal distance X between each outer side surface of the light emitting device 800 and the inner side surface of the mount 710 facing the outer side surface of the light emitting device 800 at the bottom of the mount 710.

That is, the depth of the mount 710 is determined such that the height of the mount 710 from the upper surface of the light emitting device 810 is equal to "X", and the width of the mount 710 is determined such that the horizontal distance between each outer side surface of the light emitting device 800 and the inner side surface of the mount 710 facing the outer side surface of the light emitting device 800 at the bottom of the mount 710 is equal to "X".

Where the light emitting device 800 has a square shape having four side surfaces, the mount 710 may be formed such that the width of the mount 710 is determined such that the horizontal distance between each of the four side surface of the light emitting device 800 and the side surface of the mount 710 facing the side surface of the light emitting device 800 at the bottom of the mount 710 is equal to "X".

Taking into consideration the fact that the light emitting device 800 typically has a height of about 100 μm, a length of about 1 mm, and a width of about 1 mm, it is preferred that the depth of the mount 710 be 0.2 to 0.6 mm. It is also preferred that the length and width of the mount 710 be 1.2 to 2 mm.

That is, the depth of the mount 710 may be 2 to 6 times the height of the light emitting device 800. Also, the length or width of the mount 710 may be 1.2 to 2 times the length or width of the light emitting device 800.

The height of the mount 710 from the upper surface of the light emitting device 800 may be 1 to 5 times the height of the light emitting device 800. The horizontal distance between the mount 710 and the light emitting device 800 may be 0.1 to 0.5 times the length or width of the light emitting device 800.

The inner side surfaces of the mount 710 may be included to have a certain inclination θ. It is preferred that the inclination of the side surfaces of the mount 710 be 0 to 30° from a virtual vertical line.

Figure 38:
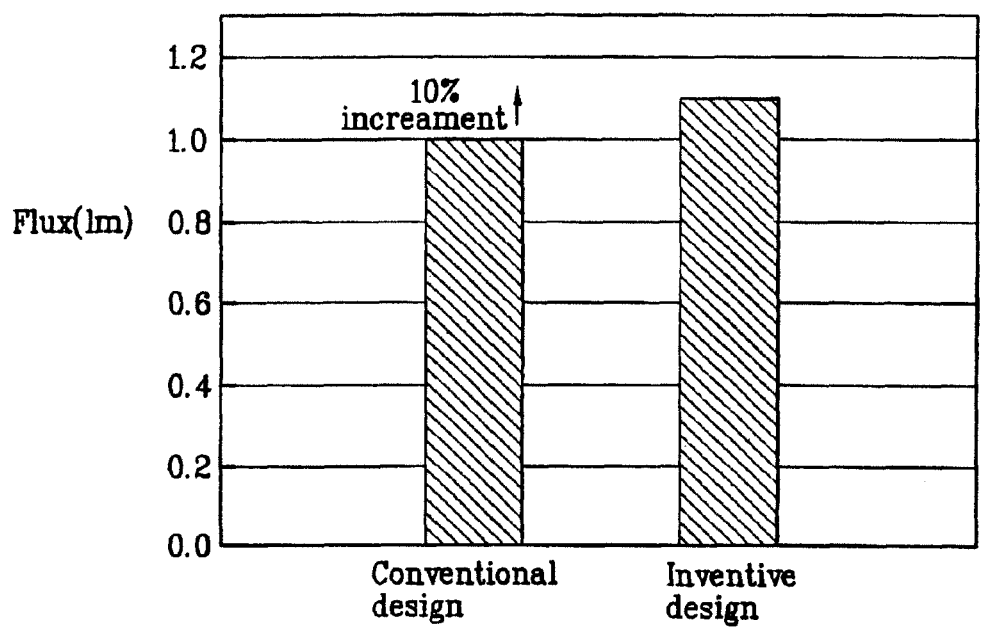

FIG. 38 depicts flux data of a general light emitting device package and flux data of the light emitting device package according to the tenth embodiment of the present invention. Referring to FIG. 38, it can be seen that an increase in flux by 10% is achieved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package, comprising:
    a substrate having a recess portion and a side groove, the recess portion comprising a bottom surface and a side surface;
    an electrode on the substrate, wherein the electrode comprises:
        an upper electrode over an upper surface of the substrate, the upper electrode comprising:
            a first part on the bottom surface of the recess portion;
            a second part on the side surface of the recess portion; and
            a third part on a topmost surface of the substrate, the topmost surface being adjacent to the side surface of the recess portion;
        a lower electrode over a lower surface of the substrate; and
        a side electrode configured to connect the upper electrode to the lower electrode, the side electrode comprising:
            a fourth part over an upper area of the side groove; and
            a fifth part over a lower area of the side groove, and configured to be connected to the second part via the third and fourth parts, the second part and the fifth part disposed back to back;
    a light emitting device on the recess portion of the substrate, the light emitting device configured to be electrically connected to the electrode;
    a transparent layer covering the light emitting device; and
    a phosphor layer on the transparent layer, the phosphor layer comprising a width facing the light emitting device, wherein a width of the phosphor layer is greater than a width of the light emitting device and wherein the phosphor layer is outside of the recess portion,
    wherein a space between a horizontal plane extending from a contact portion in a horizontal direction and the topmost surface of the substrate overlaps with the recess portion in the horizontal direction perpendicular to a thickness direction of the substrate, and
    wherein the fourth part downwardly and outwardly inclined contacts the fifth part downwardly and inwardly inclined, at the contact portion.

2. The light emitting device package according to claim 1, wherein a thickness of the transparent layer arranged over an upper surface of the light emitting device is substantially equal to a width of the transparent layer between a side of the adjacent recess portion and a side of the light emitting device.

3. The light emitting device package according to claim 1, wherein the substrate comprises at least one of a ceramic and a silicon.

4. The light emitting device package according to claim 1, wherein the light emitting device is flip-chip bonded to the electrode.

5. The light emitting device package according to claim 1, wherein the transparent layer comprises a silicone gel or an epoxy resin.

6. The light emitting device package according to claim 1, wherein the phosphor layer entirely covers the transparent layer.

7. The light emitting device package according to claim 1, wherein the thickness of the transparent layer arranged over the light emitting device is relatively thicker than that of the phosphor layer.

8. The light emitting device package according to claim 1, wherein the transparent layer has a first surface facing the phosphor layer and the phosphor layer has a second surface facing the transparent layer, and wherein the area of the second surface is larger than the area of the first surface.

9. The light emitting device package according to claim 1, further comprising an adhesive layer between the transparent layer and the phosphor layer.

10. The light emitting device package according to claim 1, wherein the transparent layer contacts the phosphor layer.

11. The light emitting device package according to claim 1, wherein the transparent layer contacts the light emitting device.

12. The light emitting device package according to claim 1, wherein the phosphor layer covers the recess portion.

13. The light emitting device package according to claim 1, wherein the width of the phosphor layer is greater than a width of the recess portion.

14. The light emitting device package according to claim 1, wherein the phosphor layer is on an upper surface of the substrate.

15. The light emitting device package according to claim 1, wherein the upper electrode is extended from the bottom surface to the side surface of the recess portion.

16. The light emitting device package according to claim 15, wherein a thickness of the transparent layer arranged over an upper surface of the light emitting device is substantially equal to a width of the transparent layer between a side of the adjacent recess portion and a side of the light emitting device.

17. The light emitting device package according to claim 15, wherein the phosphor layer is over an upper surface of the substrate.

18. The light emitting device according to claim 1, wherein a width of the phosphor layer substantially corresponds to a width of an opening of the recess portion.

19. The light emitting device according to claim 1, wherein a first slope of the upper area of the side groove is different from a second slope of the lower area of the side groove.

20. The light emitting device according to claim 19, wherein one of the first and the second slopes is positive and the other of the first and the second slopes is negative.

21. The light emitting device according to claim 1, wherein the first, the second, and the third parts of the upper electrode are integrally formed.

22. The light emitting device according to claim 1, wherein the first part of the upper electrode is positioned lower than the second part of the upper electrode,
    wherein the second part of the upper electrode is positioned lower than the third part of the upper electrode, and
    wherein the first, the second, and the third parts of the upper electrode are configured to be electrically connected to one another.

23. The light emitting device according to claim 1, wherein a third slope of the second part of the upper electrode is substantially the same as a second slope of the lower area of the side groove.

* * * * *